United States Patent
Herzer et al.

(10) Patent No.: US 8,013,655 B2
(45) Date of Patent: Sep. 6, 2011

(54) APPARATUS AND METHOD FOR EFFICIENT LEVEL SHIFT

(75) Inventors: Stefan Herzer, Ilmenau (DE); Ferdinand Stettner, Dachau (DE); Bernhard Wicht, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/855,419

(22) Filed: Aug. 12, 2010

(65) Prior Publication Data
US 2011/0037509 A1 Feb. 17, 2011

(30) Foreign Application Priority Data
Aug. 13, 2009 (DE) .......................... 10 2009 037 486

(51) Int. Cl.
*H03L 5/00* (2006.01)
(52) U.S. Cl. ............................. 327/333; 326/62; 326/81
(58) Field of Classification Search .............. 326/62–63, 326/80–81; 327/306, 333
See application file for complete search history.

(56) References Cited

U.S. PATENT DOCUMENTS

| 5,742,196 | A | 4/1998 | Fronen et al. | |
|---|---|---|---|---|
| 6,043,698 | A | 3/2000 | Hill | |
| 6,501,321 | B2 * | 12/2002 | Kumagai | 327/333 |
| 6,664,822 | B2 * | 12/2003 | Watabe | 327/108 |
| 7,495,482 | B2 * | 2/2009 | Sakai et al. | 327/108 |
| 2002/0014900 | A1 | 2/2002 | Swonger et al. | |
| 2006/0208759 | A1 | 9/2006 | Nojiri | |

FOREIGN PATENT DOCUMENTS

| DE | 10257438 | 11/2003 |
|---|---|---|
| DE | 102007050049 | 10/2009 |
| JP | 200760344 | 2/1989 |

* cited by examiner

*Primary Examiner* — Dinh T. Le
(74) *Attorney, Agent, or Firm* — John J. Patti; Wade J. Brady, III; Frederick J. Telecky, Jr.

(57) ABSTRACT

An apparatus is provided that uses a first level shifter for performing a voltage shift of a low level input signal of a first voltage domain to a high level output signal of a second voltage domain. The first level shifter comprises a storing element in the second voltage domain, an input stage coupled to the storing element for providing a signal state to be stored in the storing element and a feedback loop from an output of the storing element to the input stage for controlling the input stage in response to a transition of a high level output signal of the storing element.

20 Claims, 5 Drawing Sheets

APPARATUS AND METHOD FOR EFFICIENT LEVEL SHIFT

CROSS-REFERENCE TO RELATED APPLICATIONS

This application is claims priority from German Patent Application No. 10 2009 037 486.8, filed Aug. 13, 2009, which is hereby incorporated by reference for all purposes.

TECHNICAL FIELD

The invention relates to level shifting and, more particularly, to level shifting between high voltage and low voltage domains.

BACKGROUND

A level shifter is used in order to propagate signals through different supply voltage domains. For example, a low voltage ground-referred control signal may be converted into a high voltage signal. In automotive applications, the high supply voltage domain can have voltage levels up to 60V, while the control signal can be issued from a 3V supply voltage domain. In order to minimize power dissipation, quiescent currents and discharging capacitors are generally avoided. This is particularly relevant for applications using charge pumps or bootstrapping. Propagation delays through the level shifters should also be optimized, and the level shifters should provide failsafe start-up conditions. One of the most common level shifters is the cross-coupled level shifter. Cross-coupled level shifters have large cross conduction losses during switching events, and there is no default output state.

Turning to FIG. 1, a resistor based level shifter 100 can be seen. The level shifter 100 generally comprises resistor R1, PMOS transistor Q1, NMOS transistors Q2 and Q3, and diode D1. The resistor R1 is a pull-up resistor that is coupled to the high voltage domain, receiving high voltage level VBOOT. Transistor Q3 is coupled with its channel in series to the resistor R1, and the gate of transistor Q3 receives the low level input signal IN from the low supply voltage domain. Transistors Q1 and Q2 form an inverter in the high supply voltage domain between node N1 and the high supply voltage level VBOOT. Diode D1 is coupled between the source of transistor Q2 and node N1. The output node OUT provides the level shifted version of the input signal in the high supply voltage domain. This level shifter 100 has large quiescent current in its on-state through the resistor R1. Furthermore, the speed is limited by the large voltage swing at resistor R1. However, a small value of R provides quick turn-off. This means that the size of the resistor R provides a trade-off between quiescent current and speed.

SUMMARY

In accordance with a preferred embodiment of the present invention, an IC is provided which comprises a first level shifter for performing a voltage shift of a low level input signal of a first voltage domain to a high level output signal of a second voltage domain. The first level shifter may comprise a storing element (for example, a latch or a flip-flop) in the second voltage domain, an input stage coupled to the storing element for providing a signal state to be stored in the storing element and a feedback loop from an output of the storing element to the input stage for controlling the input stage in response to a transition of a high level output signal of the storing element. An IC according to this aspect of the invention with a corresponding level shifter combines the advantages of various existing level shifter concepts in a very efficient way. The key advantages are fast switching, a default state, minimum average DC or quiescent currents, small size, safe switching, and high versatility (i.e., DC-DC converters, motor control, solenoids etc.). Furthermore, the switching delay is independent from the actual high voltage level. The IC according to these aspects of the invention is suitable for bootstrapping and applications requiring low quiescent current at the high voltage supply.

In accordance with a preferred embodiment of the present invention, the input stage may comprise a first switch and a first resistor coupled in series with the switch. There can be a first node between the resistor and the switch which can be coupled to an input of the storing element. A control gate of the first switch may then be controlled through the feedback loop (e.g., a low level feedback signal derived from the output signal of the storing element) which can be logically combined with the low level input signal. The feedback signal from the output of the storing element and the low level input may be combined in a control stage or logic stage having some logic gates. The control gate may then be controlled so as to open (turn on) in response to a transition of the low level input signal and to close (turn off) in response to a subsequent transition of the high level output signal. This provides that only a short pulse is generated on the node for changing the state of the storing element. The state may then be stored in the storing element. The feedback configuration provides that the optimum timing for changing the state of the storing element is achieved. There may also be a second node between a second resistor and a second switch which can be coupled to a second input of the storing element. A control gate of the second switch may then be controlled through the feedback loop (e.g. a low level feedback signal derived from the output signal of the storing element) which can also be logically combined with the low level input signal.

In accordance with a preferred embodiment of the present invention, the input stage may then include two branches, each of which includes a switch and a resistor. The two nodes between the resistors and the switches may then be coupled to the inputs of a flip-flip, for example a RS flip-flip (for example, an active low RS flip-flip) which can then serve as a storing element. The switches of the input stage may then both be controlled as previously described. This is advantageous as this kind of flip-flop is reset dominated. This characteristic and the feedback loop provide that the default state of the storing element after power on is always correctly assumed.

In accordance with a preferred embodiment of the present invention, the IC may include a second level shifter for converting a high level input signal into a low level output signal. The second level shifter may be different from the first level shifter. The second level shifter may be included in the feedback loop. The second level shifter may be coupled to convert the high level output signal of the storing element into a low level feedback signal. The second level shifter can have a capacitively decoupled input. This provides that the switches can be driven with low level signals. A capacitively decoupled level shifter can more advantageously be used in the feedback loop than as a substitute for the first level shifter, since a capacitively decoupled level shifter is less robust with respect to changes and transitions of the power supply.

In accordance with a preferred embodiment of the present invention, the input stage comprises a charge injecting stage for compensating a charge from a parasitic capacitance of the first switch. This relates to a problem that may occur if a switch, as for example a transistor is coupled in series with a resistor (for example a pull-up resistor). If the switch is turned off, i.e. the transistor is turned off, and the transistor and/or the resistor are coupled to the high voltage level, this can cause a current through the resistor and pull down the node between switch and resistor. Since the transistor is turned off, the node may remain at the respective voltage level and this can cause errors and malfunctions. In this aspect of the invention, a charge injection stage is provided which injects sufficient charge into the node between the switch and resistor so as to avoid the undesired effect.

In accordance with a preferred embodiment of the present invention, the first switch may be a first MOSFET and the charge injecting stage may comprise a third MOSFET that matches with the first MOSFET. There may further be a current minor configured to minor a charge from the third MOSFET into the first node. This a robust and efficient implementation of a charge injecting stage. The ratio of the current minor may then be greater than 1 or even greater than 10 in order to amplify the mirrored current.

In accordance with a preferred embodiment of the present invention, a DC-DC converter is provided. The DC-DC converter may then comprise a control stage for generating a low level signal of a first voltage domain and a gate driver for driving a high side power switch in response to the low level signal with a high level signal of a second voltage domain. There is further a level shifter coupled between the control stage and the gate driver for converting the low level signal into a high level signal. The level shifter can comprise a storing element in the second voltage domain and an input stage coupled to the storing element for providing an input signal to be stored in the storing element. There can be a feedback loop from an output of the storing element to the input stage for controlling the input stage in response to a transition of the output signal of the storing element. Further aspects can be derived from the description of the IC. Using a level shifter according to aspects of the invention for a DC-DC converter is an advantageous application for the level shifter. The DC-DC converter is more robust and has safe switching independent from transients and DC levels of the supply voltage levels. The level shifter according to aspects of the invention can advantageously be used for applications as, for example motor control or for solenoids.

In accordance with a preferred embodiment of the present invention, a method of level shifting is provided. A low level input signal can be converted from a first voltage domain into a high level output signal of a second voltage domain. An input signal of a storing element can be set in the second voltage domain in response to the low level input signal. The input signal of the storing element may then be reset in response to an output signal of the storing element. In other words, a transition of the input signal triggers a change of state of the storing element. However, once the output of the storing element has changed, a feedback loop provides that the input is switched back. This aspect of the invention provides that a power consuming state is only assumed during a short period of time. As soon as the required change of state is achieved, the power consuming state can be left.

In accordance with a preferred embodiment of the present invention, an apparatus is provided. The apparatus comprises an input stage having a first branch and a second branch; a first flip-flop having a first input terminal, a second input terminal, and an output terminal, wherein the first input terminal of the first flip-flop that is coupled to the first branch, and wherein the second input terminal of the first flip-flop is coupled to the second branch, and wherein the first flip-flop operates in a first voltage domain; a level shifter that is coupled to the output terminal of the first flip-flop, wherein the level shifter operates in a second voltage domain, and wherein the level shifter includes: a reset stage having a first capacitor that is coupled to the output terminal of the first flip-flop; a set stage having a second capacitor that is coupled to the output terminal of the first flip-flop; and a second flip-flop having a first input terminal, a second input terminal, and an output terminal, wherein the first input terminal of the second flip-flop is coupled to the reset stage, and wherein the second input terminal of the second flip-flop is coupled to the set stage; and a logic circuit that is coupled to the output terminal of the second flip-flop, the first branch, and the second branch, and that receives an input signal.

In accordance with a preferred embodiment of the present invention, apparatus further comprises the first-flop is an active low flip-flop.

In accordance with a preferred embodiment of the present invention, the first branch further comprises: a first resistor that receives a first voltage from the first voltage domain and that is coupled to the first input terminal of the first flip-flop; and a first MOS transistor that is coupled to the first resistor at its drain and that is coupled to the logic circuit at its gate.

In accordance with a preferred embodiment of the present invention, the second branch further comprises: a second resistor that receives the first voltage from the first voltage domain and that is coupled to the second input terminal of the first flip-flop; and a second MOS transistor that is coupled to the second resistor at its drain and that is coupled to the logic circuit at its gate.

In accordance with a preferred embodiment of the present invention, the logic circuit further comprises: an AND gate that is coupled to the output terminal of the second flip-flop and to the gate of the second MOS transistor and that receives the input signal; and a NOR gate that is coupled to the output terminal of the second flip-flop and to the gate of the first MOS transistor and that receives the input signal.

In accordance with a preferred embodiment of the present invention, the reset stage further comprises an inverter that is coupled between the first capacitor and the first input terminal of the second flip-flop.

In accordance with a preferred embodiment of the present invention, the set stage further comprises a plurality of inverters coupled in series with one another between the second capacitor and the second input terminal of the second flip-flop.

In accordance with a preferred embodiment of the present invention, an apparatus is provided. The apparatus comprises a high voltage rail; a low voltage rail; a control circuit having a first output terminal and a second output terminal, wherein the control circuit is coupled to the low voltage rail; a level shifter having: an input stage having a first branch and a second branch that are each coupled to the high voltage rail; a first flip-flop having a first input terminal, a second input terminal, and an output terminal, wherein the first input terminal of the first flip-flop that is coupled to the first branch, and wherein the second input terminal of the first flip-flop is coupled to the second branch, and wherein the first flip-flop is coupled to the high voltage rail; a reset stage having a first capacitor that is coupled to the output terminal of the first flip-flop, wherein the reset stage is coupled to the low voltage rail; a set stage having a second capacitor that is coupled to the output terminal of the first flip-flop, wherein the set stage is coupled to the low voltage rail; and a second flip-flop having a first input terminal, a second input terminal, and an output terminal, wherein the first input terminal of the second flip-flop is coupled to the rest stage, and wherein the second input terminal of the second flip-flop is coupled to the set stage, and wherein the second flip-flop is coupled to the low voltage rail;

and a logic circuit that is coupled to the output terminal of the second flip-flop, the first branch, the second branch, and the first output terminal of the control circuit; a high side driver that is coupled to the output terminal of the first flip-flop; a low side driver that is coupled to the second output terminal of the control circuit; a current sensing circuit that is adapted to receive a current feedback signal; an error amplifier that is adapted to receive a voltage feedback signal; and a summing comparator that is coupled to the current sensing circuit, the voltage sensing circuit, and the control circuit.

In accordance with a preferred embodiment of the present invention, the first branch further comprises: a first resistor that is coupled to the first input terminal of the first flip-flop and the high voltage rail; and a first MOS transistor that is coupled to the first resistor at its drain and that is coupled to the logic circuit at its gate.

In accordance with a preferred embodiment of the present invention, the second branch further comprises: a second resistor that is coupled to the second input terminal of the first flip-flop and the high voltage rail; and a second MOS transistor that is coupled to the second resistor at its drain and that is coupled to the logic circuit at its gate.

In accordance with a preferred embodiment of the present invention, the logic circuit further comprises: an AND gate that is coupled to the output terminal of the second flip-flop, the gate of the second MOS transistor, and the first output terminal of the control circuit; and a NOR gate that is coupled to the output terminal of the second flip-flop, the gate of the first MOS transistor and that receives the input signal, and the first output terminal of the control circuit In accordance with a preferred embodiment of the present invention, the apparatus further comprises: a high side switch that is coupled to the high side driver and a switching node; a low side switch that is coupled to the low side driver and the switching node; an inductor that is coupled to the switching node; a resistor-capacitor (RC) network that is coupled in parallel to the inductor, wherein the RC network is coupled to the current sensing circuit; and a voltage divider that is coupled to the inductor and the error amplifier.

In accordance with a preferred embodiment of the present invention, an apparatus is provided. The apparatus comprises a high voltage rail; a low voltage rail; an input stage having: a first resistor that is coupled to the high voltage rail; a first MOS transistor that is coupled to the first resistor at its drain; a second resistor that is coupled to the high voltage rail; and a second MOS transistor that is coupled to the second resistor at its drain; a first flip-flop having a first input terminal, a second input terminal, and an output terminal, wherein the first input terminal of the first flip-flop that is coupled to the first resistor, and wherein the second input terminal of the first flip-flop is coupled to the second resistor, and wherein the first flip-flop is coupled to the high voltage rail; a reset stage having a first capacitor that is coupled to the output terminal of the first flip-flop, wherein the reset stage is coupled to the low voltage rail; a set stage having a second capacitor that is coupled to the output terminal of the first flip-flop, wherein the set stage is coupled to the low voltage rail; and a second flip-flop having a first input terminal, a second input terminal, and an output terminal, wherein the first input terminal of the second flip-flop is coupled to the rest stage, and wherein the second input terminal of the second flip-flop is coupled to the set stage, and wherein the second flip-flop is coupled to the low voltage rail; and a logic circuit that is coupled to the output terminal of the second flip-flop, the first branch, the second branch, and that receives an input signal.

In accordance with a preferred embodiment of the present invention, the apparatus further comprises: a first charge injection stage having: a third MOS transistor, wherein the third MOS transistor matches the first MOS transistor; and a first current minor that is coupled to the high voltage rail, the third MOS transistor, and a node between the first resistor and the first MOS transistor; and a second charge injection stage having: a fourth MOS transistor, wherein the fourth MOS transistor matches the second MOS transistor; and a second current mirror that is coupled to the high voltage rail, the fourth MOS transistor, and a node between the second resistor and the second MOS transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Figure 1:
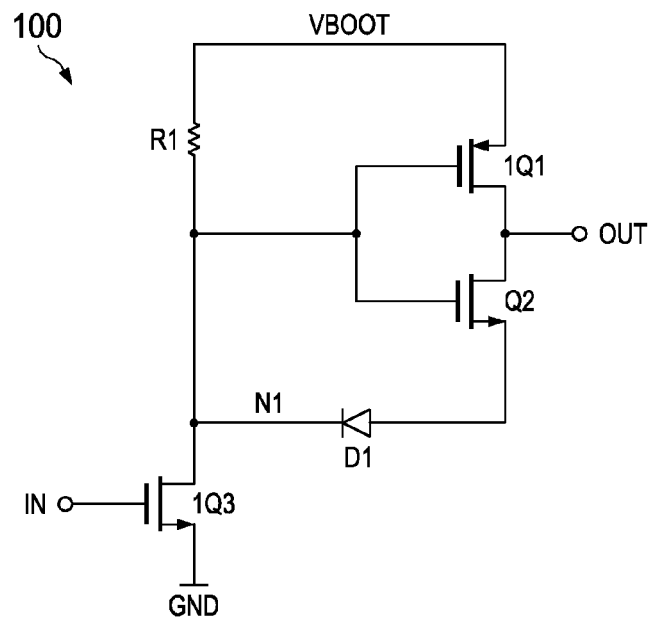
FIG. 1 is a circuit diagram of a conventional level shifter.

Refer now to the drawings wherein depicted elements are, for the sake of clarity, not necessarily shown to scale and wherein like or similar elements are designated by the same reference numeral through the several views.

Figure 2:
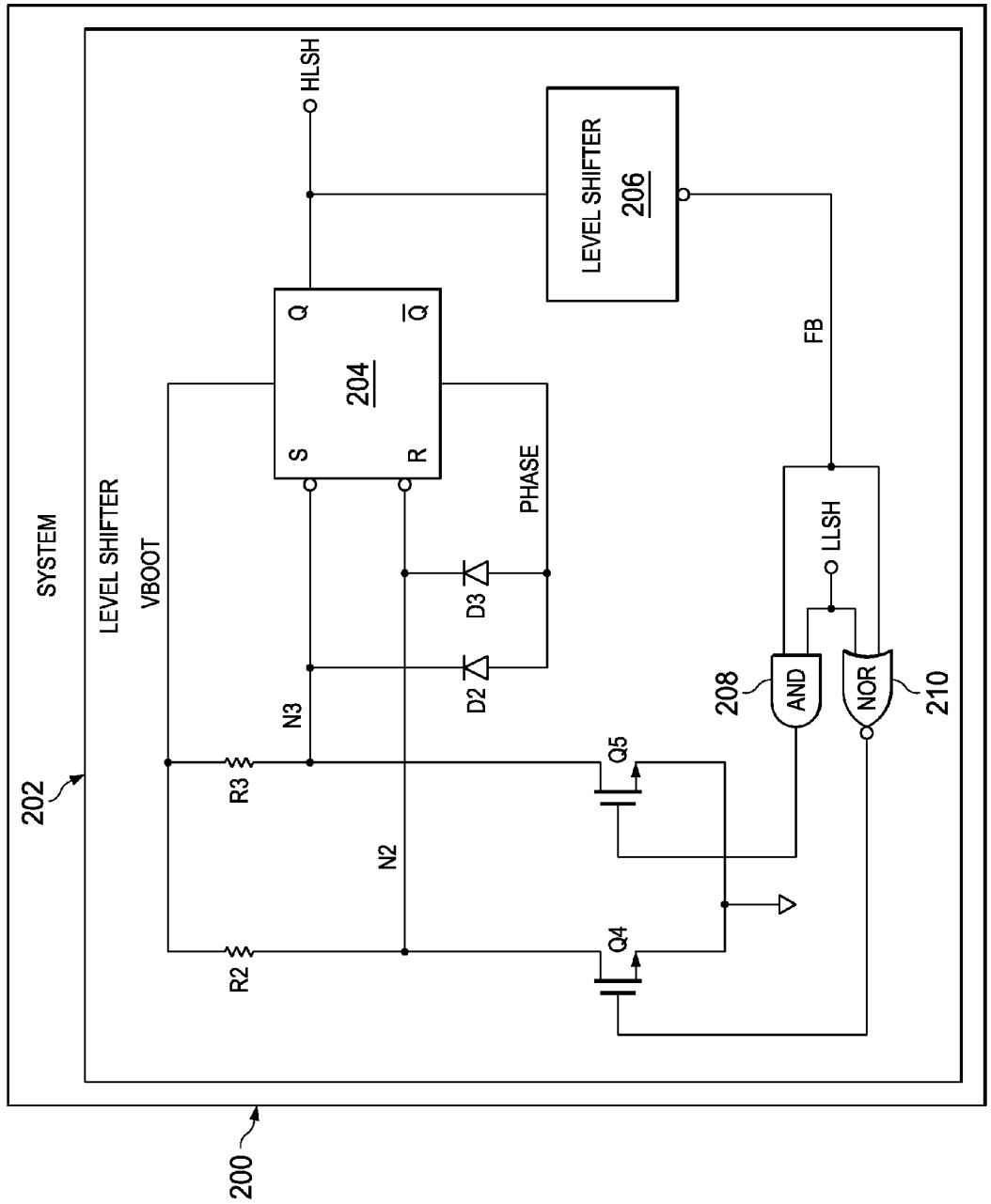
FIG. 2 is a simplified circuit diagram of an example of a system in accordance with a preferred embodiment of the present invention.

Turning to FIG. 2, an example of a system 200 in accordance with a preferred embodiment of the present invention can be seen. System 200 generally comprises a level shifter 202, which is configured to receive a low level input signal LLSH and to provide a high level output signal HLSH. The level shifter 202 generally comprises a storing element 204 (which can be an active low RS flip-flop), resistors R2 and R3, diodes D2 and D3, transistors Q4 and Q5 (which are typically NMOS transistors), AND gate 208, NOR gate 210, and level shifter 206. Here, active low means that the RS flip-flop 204 remains unchanged if both input signals are high and changes with low pulses of the respective input signal at the reset input R or at the set input S. The inputs of the flip-flop 204 are coupled to an input stage, which includes resistors R2 and R3 and transistors Q4 and Q5. The input stage has two branches, each of which includes a pull-up resistor R2 or R3 and a transistor Q4 or Q5, respectively. In each branch, the channel of the transistor Q4 or Q5 is coupled in series with the respective resistor R2 or R3 at nodes N2 and N3, respectively. Additionally, each resistor R2 and R3 is coupled to the high supply voltage level VBOOT (which may be up to 60V or more). Node N2 and N3 are coupled to the R and S inputs, respectively, of the flip-flop 204. The gates of transistors Q4 and Q5 are coupled to logic gates 210 and 208, respectively, which provide the required control signals for the transistors in response to the low level input signal LLSH. The logic gates 210 and 208 receive the low level input signal LLSH and also a feedback signal FB from an output of the flip-flop 204.

The flip-flop 204 belongs to the high voltage domain being coupled to receive voltages VBOOT and PHASE. The voltage difference between the voltages VBOOT and PHASE is small enough for driving a conventional logic gate or flip-flip. For example, it may be between 2V and 5V. Two diodes D2 and D3 are coupled between voltage PHASE and the set input S and the reset input R of the flip-flip 204. However, the logic gates of the input stage, i.e., the AND gate 208 and the NOR gate 210 in this example, are driven with supply voltages from the low level domain. This may be a voltage VDD between 2V and 5V and ground. This means that the output signals of the flip-flop 204 are signals of the high voltage domain and may not be applied to the logic gates of the input stage. Therefore, level shifter 206 is coupled between an output of the flip-flop 204 and the input stage for closing a feedback loop. The output signal of the second level shifter 206 is a low level feedback signal FB, which is applied to an input of the AND gate 208 and to the input of the NOR gate 210. The other input of the AND gate 208 and NOR gate 210 receive the low level input signal LLSH.

In operation, voltage levels on nodes N2 and N3 control the flip-flip 204. If the output of NOR gate 210 is high, transistor Q4 is turned on and node N2 is pulled down to ground. The reset input R of flip-flop 204 is then pulled to ground and the flip-flip 204 is reset. If the output of AND gate 208 is high, transistor Q5 is turned on, and node N3 is pulled to ground. The flip-flop 204 is then set, if the reset input R is high. The output signal HLSH of the flip-flop 204 is coupled to the input stage. This provides that the periods of time during which either the first branch or the second branch of the input stage are on, is kept very short. The combined delays through flip-flop 204, level shifter 206 and the logic gates 208 and 210 basically determine the length of the pulses applied to the inputs of the flip-flip 204. This means that the level shifter 202 performs a pulsed operation of the input stage.

In order to save current, transistors Q4 and Q5 remain turned off as long as possible. Since the flip-flip 204 is an active low RS flip-flip, the flip-flip basically remains in a state, in which the output signal is preserved. If low level input signal LLSH changes from high to low, the output Q of flip-flop 204 initially remains unchanged after a transition of the input signal LLSH. As a consequence, also the feedback signal FB remains low (there is an additional inversion in level shifter 206). The control signal of the second transistors Q5 is then low and the transistor is turned off. This means that transistor Q4 is turned on and node N2 is pulled to ground. The reset input R of flip-flip 204 is pulled to ground (i.e., it is low). The active low flip-flop 204 is reset, output Q (signal HLSH) becomes low and feedback signal FB changes from low to high. This provides that signal provided to the gate of transistors Q4 changes from high to low. Transistor Q4 is turned off, and node N2 is pulled to voltage VBOOT.

A similar situation occurs at a change of the low level input signal LLSH from low to high. This provides that a short set pulse is generated with transistors Q5 and resistor R2, while node N2 remains high. The flip-flop 202 is then set and the feedback signal FB changes to low. This provides that the signal provided to the gate of transistor Q5 changes from high to low and MN2 is turned off again.

By switching on transistor Q4, flip-flop 204 in the high voltage domain is reset, whereas by activating transistor Q5, the flip-flop is set. Resistors R3 and R4 are used as pull-up resistors during the off-state of transistors Q4 and Q5 as well as limiting the currents during the on-pulses. Generally, the state of the flip-flop 204 is sensed in a feedback loop and gated with the input signal in order to provide a pulsed operation. A logic control stage is configured to switch transistors Q4 and Q5 off, after a change of the state of the flip-flop 204. This provides that the pulses are generally long enough to change the state of the output signal HLSH. Furthermore, current consumption can be reduced. The speed of the circuit is also very high, as the resistors R1 and R2 do not need to be pulled down to the same level as in conventional level shifters in order to activate the flip-flop 204. The current can be reduced to only a few percent of the continuous current consumption in the pull-up resistors.

Alternatively, a reset-dominant RS flip-flop may be used. This provides that a default state can be achieved during start-up of the IC 200. The feedback loop provides that the input pulse only ends when the flip-flop is safely set. This provides that the level shifter 202 has default state after power on.

Figure 3:
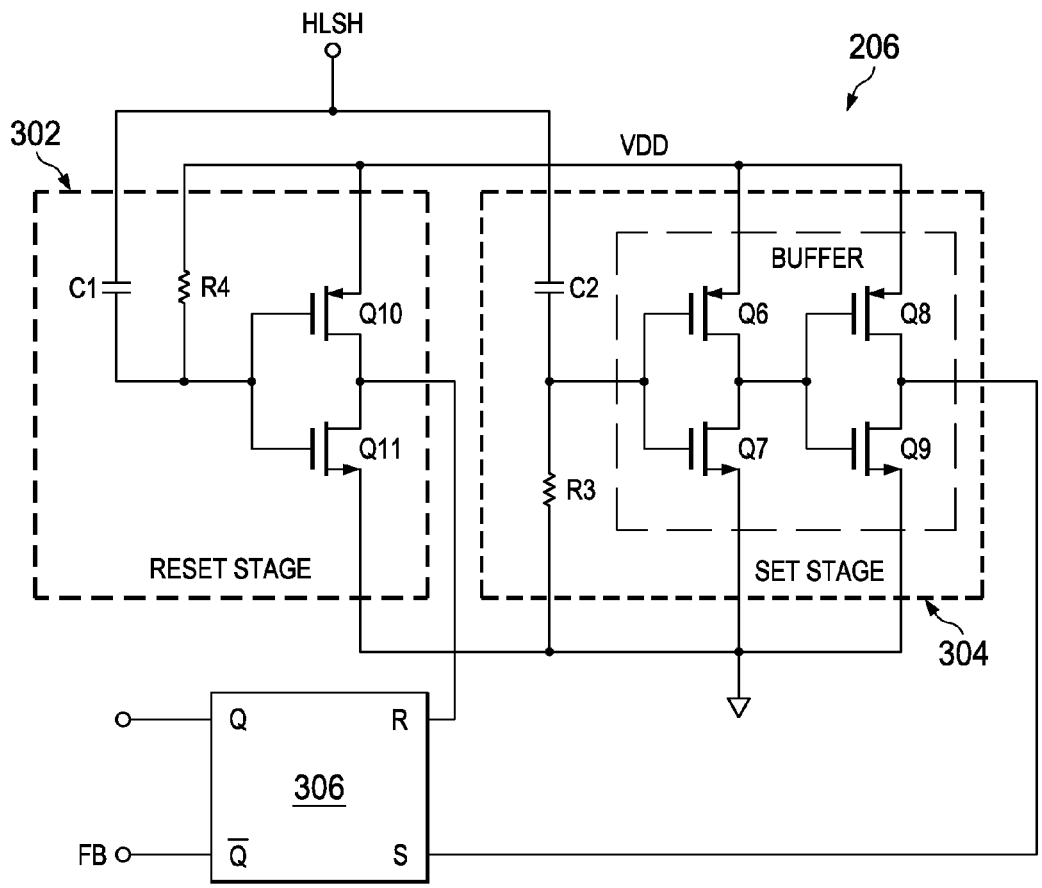
FIG. 3 is a simplified circuit diagram of an example of a level shifter of FIG. 2.

Turning now to FIG. 3, level shifter 206 can be seen in greater detail. The principle behind the operation of level shifter 206 is based on capacitive coupling. Here, level shifter 206 is suitable for converting digital states from the high level domain to the low level domain. The input signal can be a high level signal, as for example signal HLSH of FIG. 2). The output signal may then be the low level feedback signal FB. The input signal HLSH can be fed to the two capacitors C1 and C1, which provide capacitive decoupling of the remaining components of the level shifter 206. The level shifter 26 is supplied with the supply voltage level VDD of the low voltage domain. The level shifter 206 generally comprises a reset stage 302, a set stage 304, and an RS flip-flop 306. The reset stage 306 generally comprises an inverter with two transistors Q10 and Q11. The output of the inverter is coupled to the reset input R of the RS flip-flop 306. The set stage 304 generally comprises two inverters coupled in series with one another having transistors Q6 and Q7 and transistors Q8 and Q9, respectively. The output of the second inverter is coupled to the set input S of the RS flip-flop 306. The input of the inverter of the reset stage 302 is pulled to voltage level VDD (i.e., it is high) through resistor R4 which is coupled between voltage level VDD and the gates of transistors Q10 and Q11. This provides that the reset input R of the RS flip-flop 306 is normally pulled to ground. The inverted output Qbar of flip-flop 306 provides feedback signal FB.

If the input signal HLSH transitions from high to low, a negative pulse is transferred through capacitor C2, and a current flows through resistor R2. This current generates a voltage drop and pulls the input node of the set stage 304 to high. The inverters generate a positive pulse at the set input of the RS flip-flop 306 and the flip-flop 306 is set (Q becomes high and the inverted output Qbar becomes low). The reset stage 302 of the level shifter 206 remains unchanged as the same current flows through capacitors C1 and C2. However, the current through capacitor C1 flows through resistor R4 to the low level supply voltage VDD. This provides that the gate-source voltage of transistor Q11 increases. The transistor Q11 remains on and the inverter (transistor Q10 and Q11) does not change state.

If signal HLSH transitions from low to high, a current is transferred through capacitor C1, but in the opposite direction as during the setting procedure. This means that the state of the set stage 304 does not change. However, the gate-source of transistor Q11 decreases and the inverter (transistors Q11 and Q12) of the reset stage 6 changes state. The reset input R of the RS flip-flop 306 receives a high pulse and the flip-flop 306 is reset. The output Q of the flip-flop 306 changes from high to low and feedback signal FB from low to high. In this situation, set stage 304 operates similar to the reset stage 302 for the high to low transition of the input signal. There is no change on the set input S of the RS flip-flip 306.

Figure 4:
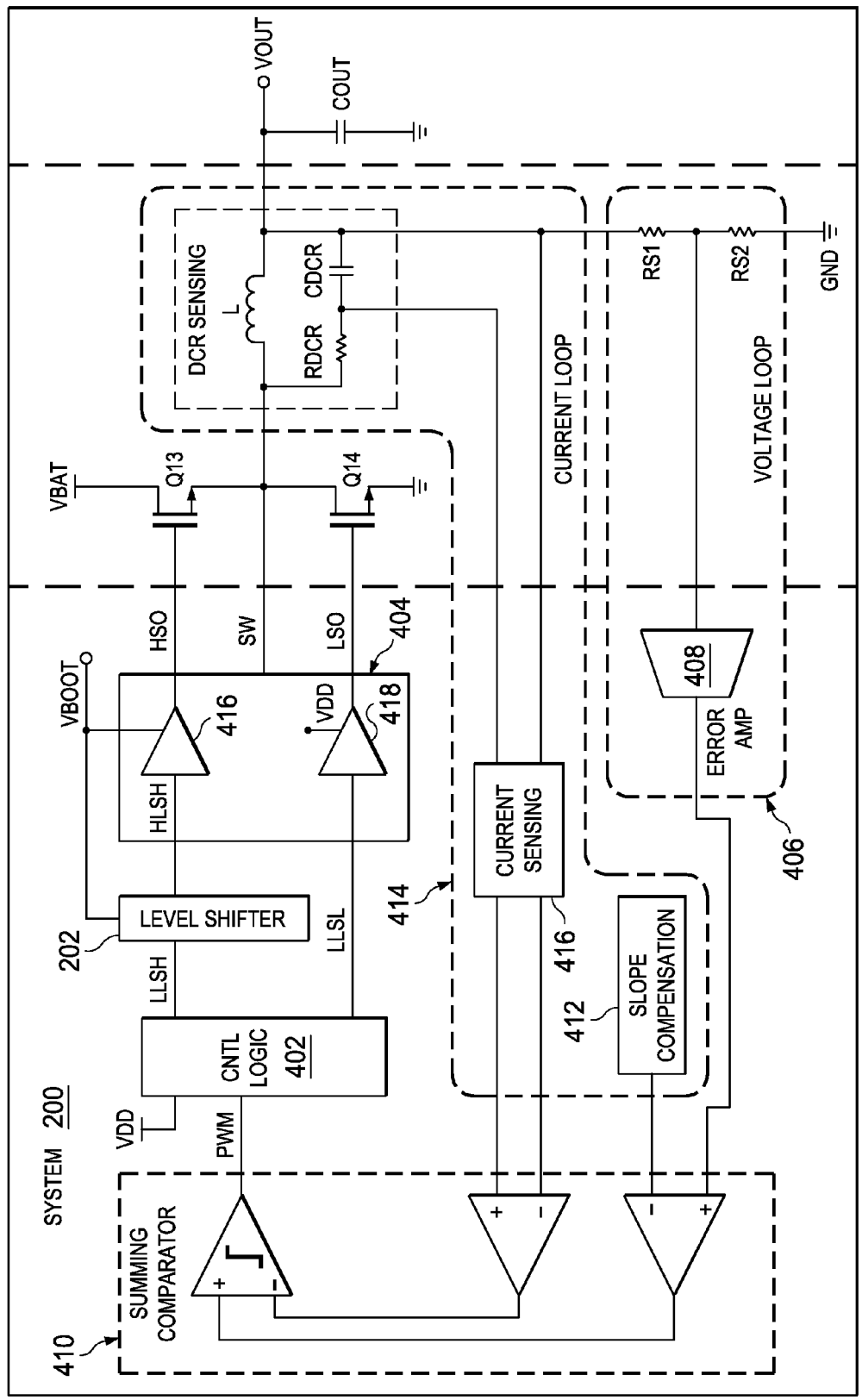
FIG. 4 is a simplified circuit diagram of a DC-DC converter that uses the level shifter of FIG. 2.

Turning to FIG. 4, system 200 is configured as a DC-DC converter. The IC 1 or parts of it may be implemented as an IC. System 200 generally comprises a level shifter 202, control logic 402, summing comparator 410, gate driving stage 404, a current loop 414, and a voltage loop 406. The control logic stage 402 generates driving signals for the gate driving stage 404. The gate driving stage 9 includes a high side driver 416 and low side driver 418. High side driver 416 is powered with the high level voltage VBOOT, and the low side driver 418 is supplied with the low level voltage VDD. The high side driver 416 provides an output signal HSO for the high side switch Q13, and the low side driver 418 provides an output signal LSO for the low side switch Q14.

Here, the low side switch Q14 and the high side switch Q13 are NMOS transistors. The high side switch Q13 is coupled to a primary power supply VBAT and the low side switch Q14 is coupled to ground. The high side switch Q13 and the low side switch Q14 are coupled at the common, switching node SW. The node SW is pulled up and down in accordance with the switching of switches Q13 and Q14. An inductor L is also coupled to node SW. The switching of switches Q13 and Q14 generates a rising and falling current through the inductor L which charges buffer capacitor COUT and provides and output voltage VOUT at the output of the DC-DC converter. The output voltage VOUT is sensed through voltage feedback loop 406 including a voltage divider with sense resistors RS1 and RS2, and an error amplifier 408. The output of the error amplifier 408 is coupled to a summing comparator 410, which also receives a slope compensation signal from a slope compensation stage 412. There is also current feedback loop 414 for sensing the current through the inductor L. A resistor RDCR and a capacitor CDCR are coupled in series with one another and in parallel to the inductor L. The voltage across the capacitor CDCR is sensed in current sensing stage 416, the outputs of which are coupled to the summing comparator 410. The summing comparator 410 provides a pulse width modulated output signal PWM in response to the sensed output voltage level VOUT and the current through the inductor L. The pulse width modulated output signal PWM of the summing comparator 410 is fed to the control stage 402, and the control stage 8 provides output signals LLSH and LLSL for the high side driver 416 and the low side driver 418, respectively. However, the high side switch Q13 uses a very high voltage level for turning on. Therefore, the high side driver 416 is supplied with a high supply voltage of a high voltage domain. The output signals of the control stage 402 are signals of the low voltage domain. Therefore, the level shifter 202 is coupled between the control stage 402 and the high side driver 416 for converting the voltage levels of signal LLSH of the low voltage domain into a signal HLSH of the high voltage domain.

Figure 5:
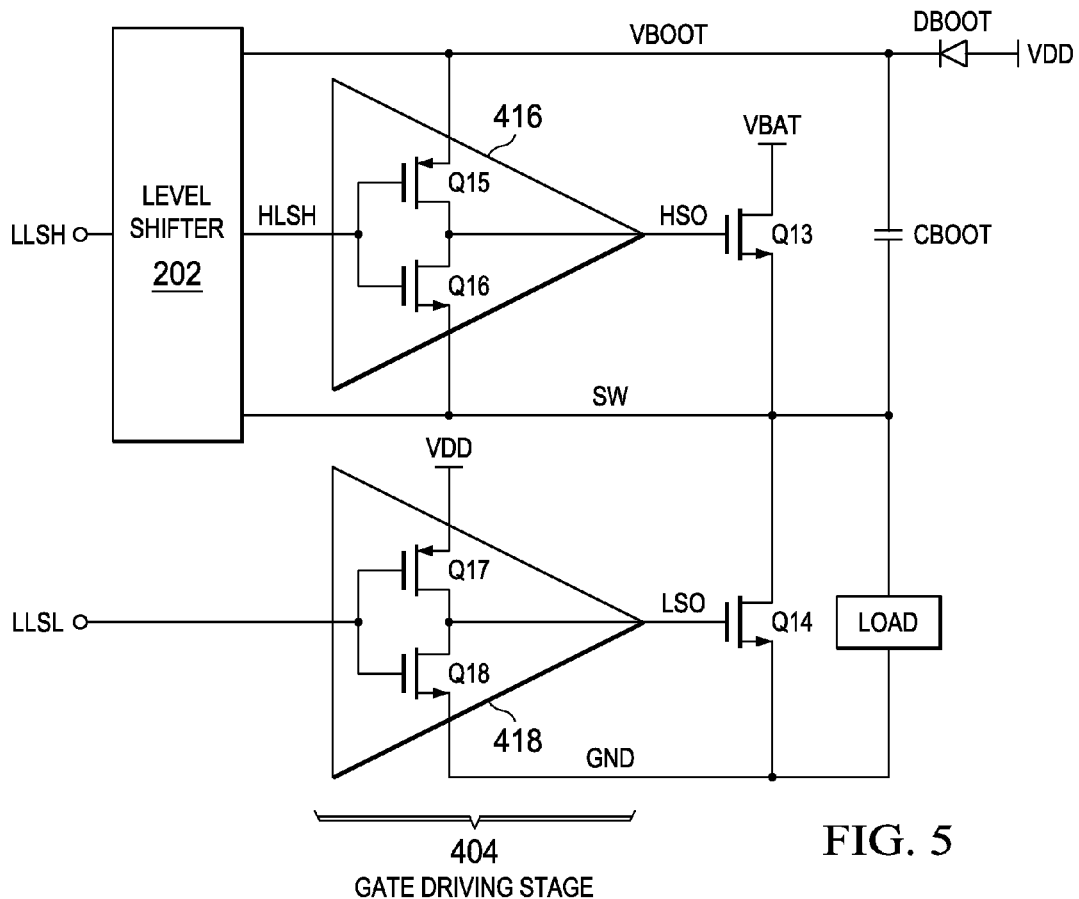
FIG. 5 is a simplified circuit diagram of a part of FIG. 4 in greater detail.

In FIG. 5, a simplified circuit diagram of a part of FIG. 4 in more detail can be seen. As shown, the high side driver 416 and low side driver 418 are inverters comprised of transistors Q15/Q16 and Q17/Q18, respectively. The level shifter 206 converts signal LLSH from the low voltage domain into signal HLSH in the high voltage domain. The high voltage domain has supply voltage levels VBOOT and PHASE, where voltage level PHASE is the voltage level at the switching node SW. The high positive voltage VBOOT is received from a power supply and coupled to VDD through a reverse-biased diode DBOOT. A capacitor CBOOT is coupled between switching node SW and the positive voltage supply VBOOT of the high voltage domain.

Figure 6:
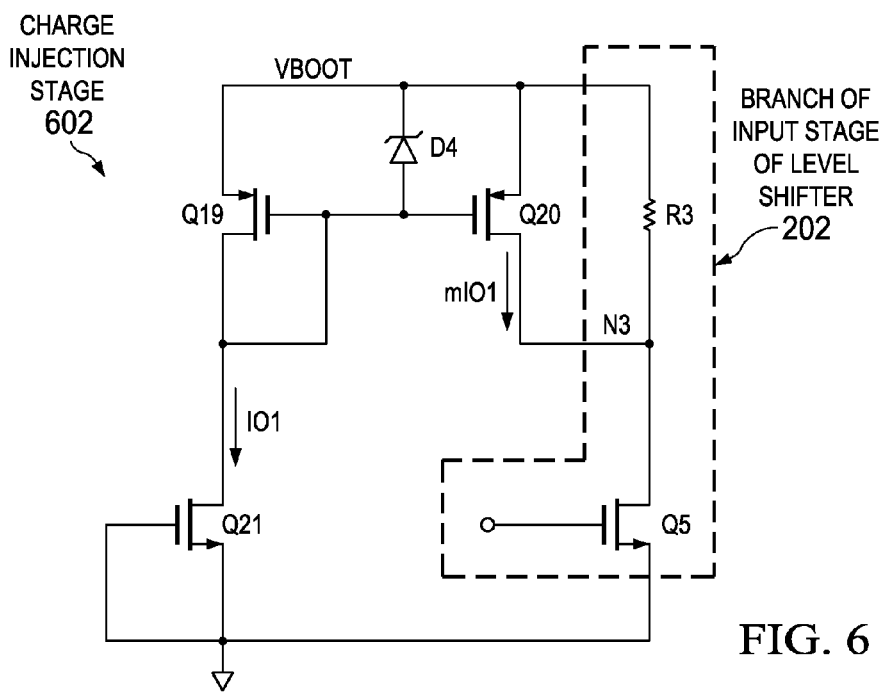
FIGS. 6 and 7 are a simplified circuit diagrams of examples of charge injection stage which can be used with the level shifter of FIG. 2.
Figure 7:
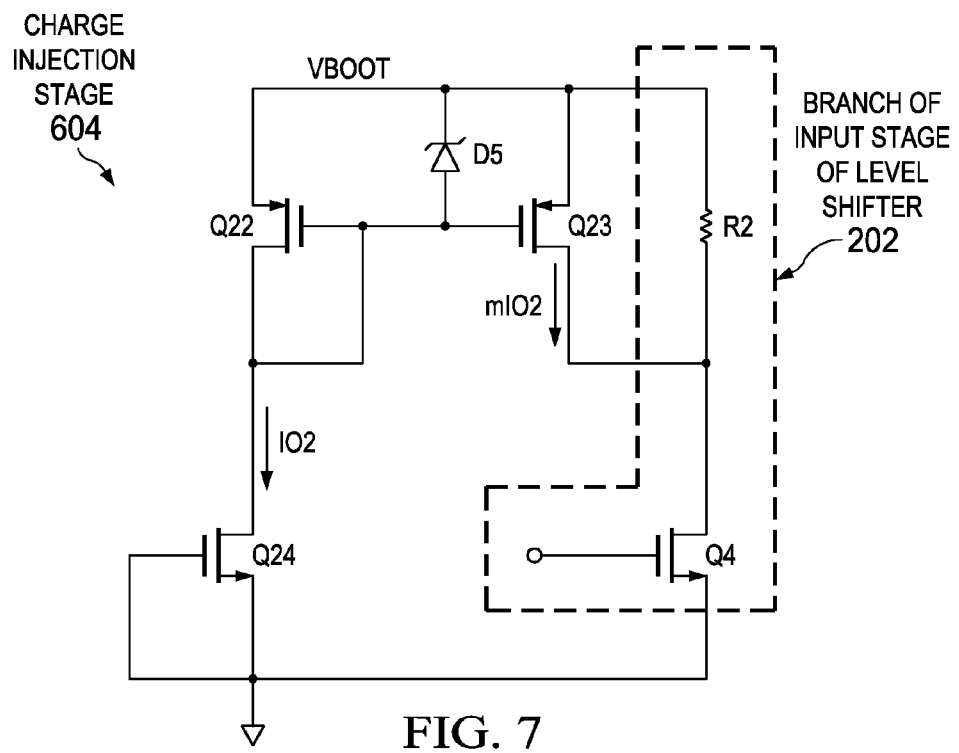

Turning to FIGS. 6 and 7, charge injection stages 602 and 604 for level shifter 202 can be seen. Level shifters 602 and 604 are used with a branch of the input stage of the level shifter 202. Each transistor Q21 and Q24 is coupled to a current minor (which including transistors Q19/Q20 or Q22/Q23). Transistors Q20 and Q23 are coupled in parallel to pull-up resistors R3 and R2, respectively. Transistors Q21 and Q24 advantageously have the same dimensions as transistor Q5 and Q4, respectively, (i.e., the two transistors match). The gate of transistors Q21 and Q24 are coupled to ground, meaning that transistors Q21 and Q24 are off. Zener diodes D1 is coupled between the common gate connection of the current minor and the high voltage supply VBOOT for over voltage protection.

In operation, transistors Q19 through Q24 generally prevent malfunction of the level shifter 202 due to parasitic capacitances of the transistors Q4 and Q5 and the different voltage levels of the high and low supply voltage domains. During a transition from low to high (i.e., if transistor Q5 is turned off) or from low to high (i.e., if transistor Q4 is turned off), a certain amount of charge can be fed through resistor R3 or R2 from supply VBOOT. Transistors Q4 and Q5 usually have parasitic capacitances between drain and source. These capacitances can be charged and irreversibly pull down node N3 or N2. Since nodes N3 and N2 are coupled to the inputs (active low) of RS flip-flop 204, signal HLSH may be adversely affected. In order to compensate the injected current, the circuit shown in FIGS. 6 and 7 may be used. The current mirrors Q19/Q20 or Q22/Q23 advantageously may have a large ratio m (for example 1:25). If transistor Q5 or Q4 is turned off, a current I01 or I02 flows into transistor Q21 or Q24, respectively. Current I01 or I02 is mirrored and amplified by the ratio of transistors Q19/Q20 or Q22/Q23. The amplified current mI01 or mIO2 may then be injected to node N3 or N2, respectively. This compensates the current or charge due to the parasitic capacitances of transistors Q5 and Q4.

Figure 8:
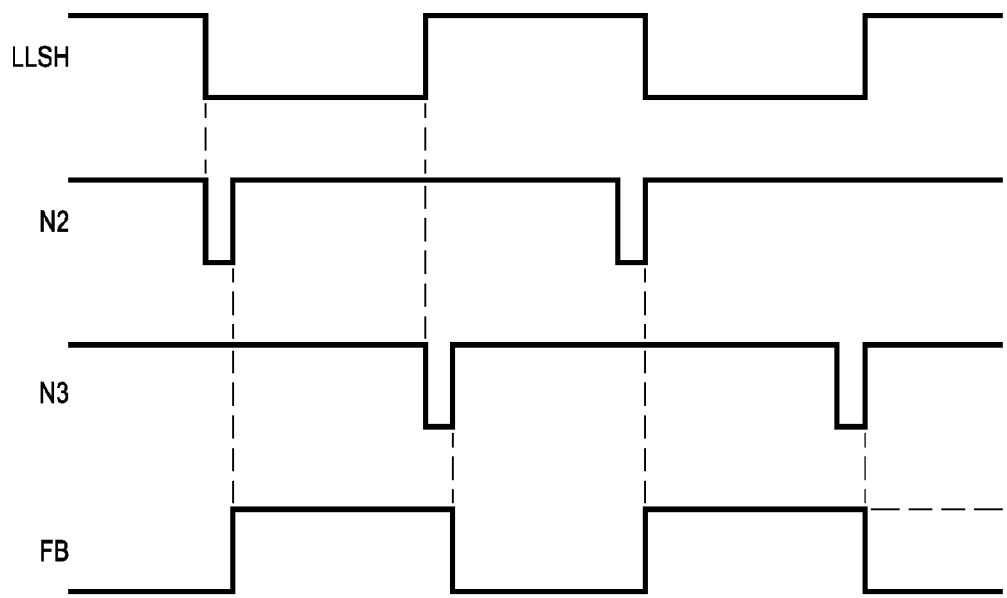
FIG. 8 shows waveforms relating to the level shifter of FIG. 2.

FIG. 8 shows waveforms level shifter 202. The low level input signal LLSH switches between high and low. The voltage levels on nodes N2 and N3 show short low pulses which are triggered with the falling and rising edges of the input signal LLSH. The short pulses of the voltage levels on nodes N2 and N3 end with a transition of the feedback signal FB which indicates a successful change of the high level output signal HLSH.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an input stage having a first branch and a second branch;
   a first flip-flop having a first input terminal, a second input terminal, and an output terminal, wherein the first input terminal of the first flip-flop that is coupled to the first branch, and wherein the second input terminal of the first flip-flop is coupled to the second branch, and wherein the first flip-flop operates in a first voltage domain;
   a level shifter that is coupled to the output terminal of the first flip-flop, wherein the level shifter operates in a second voltage domain, and wherein the level shifter includes:
      a reset stage having a first capacitor that is coupled to the output terminal of the first flip-flop;
      a set stage having a second capacitor that is coupled to the output terminal of the first flip-flop; and
      a second flip-flop having a first input terminal, a second input terminal, and an output terminal, wherein the first input terminal of the second flip-flop is coupled to the reset stage, and wherein the second input terminal of the second flip-flop is coupled to the set stage; and
   a logic circuit that is coupled to the output terminal of the second flip-flop, the first branch, and the second branch, and that receives an input signal.

2. The apparatus of claim 1, wherein the apparatus further comprises the first-flop is an active low flip-flop.

3. The apparatus of claim 2, wherein the first branch further comprises:
   a first resistor that receives a first voltage from the first voltage domain and that is coupled to the first input terminal of the first flip-flop; and
   a first MOS transistor that is coupled to the first resistor at its drain and that is coupled to the logic circuit at its gate.

4. The apparatus of claim 3, wherein the second branch further comprises:
   a second resistor that receives the first voltage from the first voltage domain and that is coupled to the second input terminal of the first flip-flop; and
   a second MOS transistor that is coupled to the second resistor at its drain and that is coupled to the logic circuit at its gate.

5. The apparatus of claim 4, wherein the logic circuit further comprises:
   an AND gate that is coupled to the output terminal of the second flip-flop and to the gate of the second MOS transistor and that receives the input signal; and
   a NOR gate that is coupled to the output terminal of the second flip-flop and to the gate of the first MOS transistor and that receives the input signal.

6. The apparatus of claim 5, wherein the reset stage further comprises an inverter that is coupled between the first capacitor and the first input terminal of the second flip-flop.

7. The apparatus of claim 6, wherein the set stage further comprises a plurality of inverters coupled in series with one another between the second capacitor and the second input terminal of the second flip-flop.

8. An apparatus comprising:
   a high voltage rail;
   a low voltage rail;
   a control circuit having a first output terminal and a second output terminal, wherein the control circuit is coupled to the low voltage rail;
   a level shifter having:
      an input stage having a first branch and a second branch that are each coupled to the high voltage rail;
      a first flip-flop having a first input terminal, a second input terminal, and an output terminal, wherein the first input terminal of the first flip-flop that is coupled to the first branch, and wherein the second input terminal of the first flip-flop is coupled to the second branch, and wherein the first flip-flop is coupled to the high voltage rail;
      a reset stage having a first capacitor that is coupled to the output terminal of the first flip-flop, wherein the reset stage is coupled to the low voltage rail;
      a set stage having a second capacitor that is coupled to the output terminal of the first flip-flop, wherein the set stage is coupled to the low voltage rail; and
      a second flip-flop having a first input terminal, a second input terminal, and an output terminal, wherein the first input terminal of the second flip-flop is coupled to the rest stage, and wherein the second input terminal of the second flip-flop is coupled to the set stage, and wherein the second flip-flop is coupled to the low voltage rail; and
   a logic circuit that is coupled to the output terminal of the second flip-flop, the first branch, the second branch, and the first output terminal of the control circuit;
   a high side driver that is coupled to the output terminal of the first flip-flop;
   a low side driver that is coupled to the second output terminal of the control circuit;
   a current sensing circuit that is adapted to receive a current feedback signal;
   an error amplifier that is adapted to receive a voltage feedback signal; and
   a summing comparator that is coupled to the current sensing circuit, the voltage sensing circuit, and the control circuit.

9. The apparatus of claim 8, wherein the apparatus further comprises the first-flop is an active low flip-flop.

10. The apparatus of claim 9, wherein the first branch further comprises:
    a first resistor that is coupled to the first input terminal of the first flip-flop and the high voltage rail; and
    a first MOS transistor that is coupled to the first resistor at its drain and that is coupled to the logic circuit at its gate.

11. The apparatus of claim 10, wherein the second branch further comprises:
    a second resistor that is coupled to the second input terminal of the first flip-flop and the high voltage rail; and
    a second MOS transistor that is coupled to the second resistor at its drain and that is coupled to the logic circuit at its gate.

12. The apparatus of claim 11, wherein the logic circuit further comprises:
    an AND gate that is coupled to the output terminal of the second flip-flop, the gate of the second MOS transistor, and the first output terminal of the control circuit; and
    a NOR gate that is coupled to the output terminal of the second flip-flop, the gate of the first MOS transistor and that receives the input signal, and the first output terminal of the control circuit.

13. The apparatus of claim 12, wherein the reset stage further comprises an inverter that is coupled between the first capacitor and the first input terminal of the second flip-flop.

14. The apparatus of claim 13, wherein the set stage further comprises a plurality of inverters coupled in series with one another between the second capacitor and the second input terminal of the second flip-flop.

15. The apparatus of claim 8, wherein the apparatus further comprises:
- a high side switch that is coupled to the high side driver and a switching node;
- a low side switch that is coupled to the low side driver and the switching node;
- an inductor that is coupled to the switching node;
- a resistor-capacitor (RC) network that is coupled in parallel to the inductor, wherein the RC network is coupled to the current sensing circuit; and
- a voltage divider that is coupled to the inductor and the error amplifier.

16. An apparatus comprising:
- a high voltage rail;
- a low voltage rail;
- an input stage having:
  - a first resistor that is coupled to the high voltage rail;
  - a first MOS transistor that is coupled to the first resistor at its drain;
  - a second resistor that is coupled to the high voltage rail; and
  - a second MOS transistor that is coupled to the second resistor at its drain;
- a first flip-flop having a first input terminal, a second input terminal, and an output terminal, wherein the first input terminal of the first flip-flop that is coupled to the first resistor, and wherein the second input terminal of the first flip-flop is coupled to the second resistor, and wherein the first flip-flop is coupled to the high voltage rail;
- a reset stage having a first capacitor that is coupled to the output terminal of the first flip-flop, wherein the reset stage is coupled to the low voltage rail;
- a set stage having a second capacitor that is coupled to the output terminal of the first flip-flop, wherein the set stage is coupled to the low voltage rail; and
- a second flip-flop having a first input terminal, a second input terminal, and an output terminal, wherein the first input terminal of the second flip-flop is coupled to the rest stage, and wherein the second input terminal of the second flip-flop is coupled to the set stage, and wherein the second flip-flop is coupled to the low voltage rail; and
- a logic circuit that is coupled to the output terminal of the second flip-flop, the first branch, the second branch, and that receives an input signal.

17. The apparatus of claim 16, wherein the logic circuit further comprises:
- an AND gate that is coupled to the output terminal of the second flip-flop and to the gate of the second MOS transistor and that receives the input signal; and
- a NOR gate that is coupled to the output terminal of the second flip-flop and to the gate of the first MOS transistor and that receives the input signal.

18. The apparatus of claim 17, wherein the reset stage further comprises an inverter that is coupled between the first capacitor and the first input terminal of the second flip-flop.

19. The apparatus of claim 18, wherein the set stage further comprises a plurality of inverters coupled in series with one another between the second capacitor and the second input terminal of the second flip-flop.

20. The apparatus of claim 19, wherein the apparatus further comprises:
- a first charge injection stage having:
  - a third MOS transistor, wherein the third MOS transistor matches the first MOS transistor; and
  - a first current mirror that is coupled to the high voltage rail, the third MOS transistor, and a node between the first resistor and the first MOS transistor; and
- a second charge injection stage having:
  - a fourth MOS transistor, wherein the fourth MOS transistor matches the second MOS transistor; and
  - a second current mirror that is coupled to the high voltage rail, the fourth MOS transistor, and a node between the second resistor and the second MOS transistor.

\* \* \* \* \*